US006173431B1

(12) United States Patent
Rittle

(10) Patent No.: US 6,173,431 B1
(45) **Date of Patent: *Jan. 9, 2001**

(54) METHOD AND APPARATUS FOR TRANSMITTING AND RECEIVING INFORMATION PACKETS USING MULTI-LAYER ERROR DETECTION

(75) Inventor: Loren J. Rittle, Naperville, IL (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/108,512

(22) Filed: Jul. 1, 1998

(51) Int. Cl.[7] .................................................. H03M 13/00
(52) U.S. Cl. ......................... 714/778; 714/746; 714/751; 714/755
(58) Field of Search .................................... 714/778, 755, 714/751, 746; 711/778; 713/503; 709/207, 252

(56) References Cited

U.S. PATENT DOCUMENTS 5,218,622 * 6/1993 Fazel et al. .......................... 375/240
5,539,755 * 7/1996 Baggen ................................ 714/779
5,563,895 * 10/1996 Malkamaki et al. ................. 714/748
5,671,237 * 9/1997 Zook .................................... 714/755
5,721,739 * 2/1998 Lyle .................................... 714/755
5,742,619 * 4/1998 Hassan ................................ 714/755
5,844,918 * 12/1998 Kato .................................... 714/751
5,872,799 * 2/1999 Lee et al. ............................ 714/755
5,881,069 * 3/1999 Cannon et al. ...................... 714/748

OTHER PUBLICATIONS

Telecommunications Industry Association, "TIA/EIA Standard, Project 25 FDMA Common Air Interface New Technology Standards Projects Digital Radio Technology Standards," TIA/EIA–102.BAAA, May 1998, pp. 21–31.

* cited by examiner

*Primary Examiner*—Albert DeCady
*Assistant Examiner*—Guy Lamarre
(74) *Attorney, Agent, or Firm*—Daniel C. Crilly; Steven A. May; Jeffrey K. Jacobs

(57) ABSTRACT

A communication device employs a method and apparatus for transmitting and receiving information packets using multiple layers of error detection. A sending communication device constructs an information packet to include user information divided into multiple data blocks, a primary error detection code for each data block, and at least a portion of a secondary protection code. The secondary protection code provides error protection for the entire information packet. The secondary protection code is selected such that it can be incrementally determined by a receiving device as data blocks are received and accepted by the receiving device, regardless of order of reception of the data blocks. Since the secondary protection code is incrementally determined, processor utilization is better regulated and delays associated with sending acknowledgments are minimized.

22 Claims, 4 Drawing Sheets

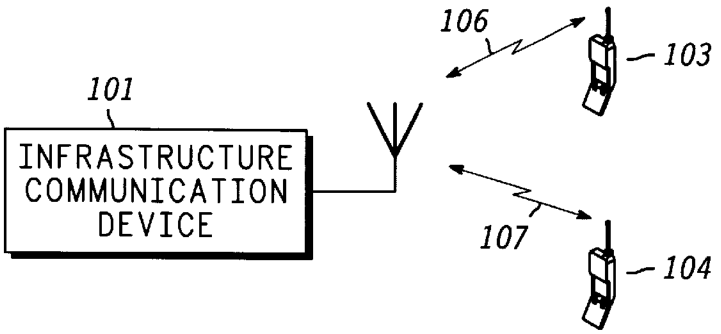
FIG. 1 100
FIG. 2
101, 103, 104
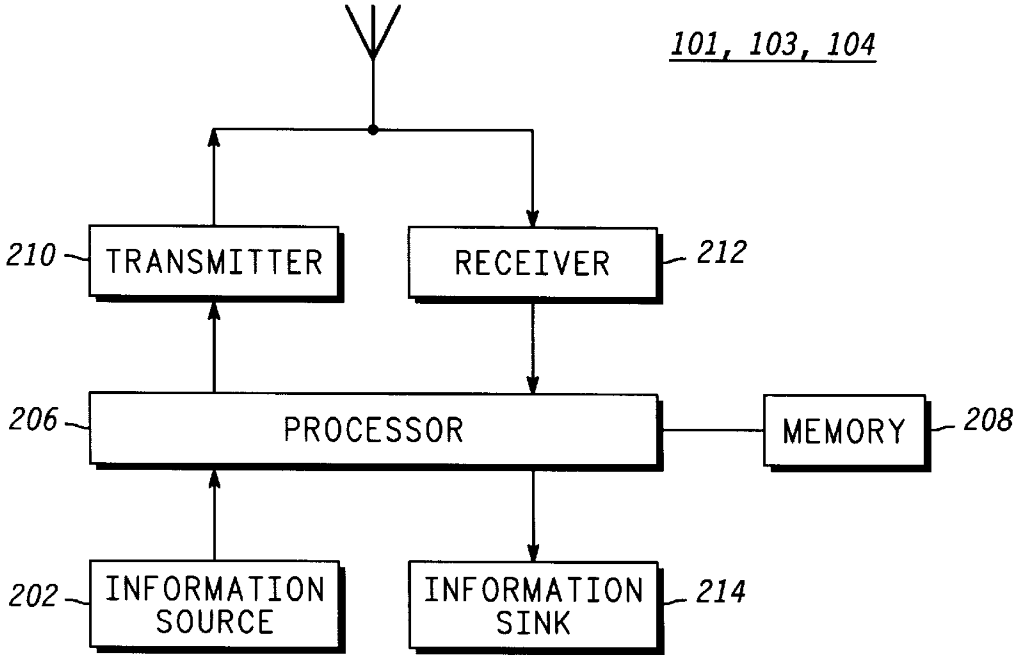

400

4/4

500

METHOD AND APPARATUS FOR TRANSMITTING AND RECEIVING INFORMATION PACKETS USING MULTI-LAYER ERROR DETECTION

FIELD OF THE INVENTION

The present invention relates generally to packet data communication systems and, in particular, to transmitting and receiving information packets using multi-layer error detection.

BACKGROUND OF THE INVENTION

Packet data communication systems are known in both the land mobile and cellular environments. In the land mobile environment, the packet data system includes a packet router, a central controller, a plurality of base sites, and a plurality of communication devices (e.g., mobile radios, portable radios, or wireless data modems). In the cellular environment, the packet data system includes a packet router, one or more base site controllers, a plurality of base sites, and a plurality of communication devices (e.g., cellular telephones).

In a typical land mobile packet data transmission, the data packet is routed from a land user to a communication device via communication protocols that reside on several so-called communication protocol layers. In accordance with the Open Systems Interconnection (OSI) nomenclature, a first protocol layer (layer 1) comprises a physical protocol, such as T1 channel framing. A second protocol layer (layer 2) typically adds a header or trailer containing error correction or detection information to the data allowing the communication device to correct or detect bit errors incurred during the transmission of the packet from a base site. A third protocol layer (layer 3) typically adds a header containing packet routing information (e.g., the appropriate Internet Protocol (IP) address for the communication device) to the data. A fourth protocol layer (layer 4) typically includes an indication of the number of packets containing the data in the packet data communication and a sequential ordering of the packets. Finally, upper protocol layers (layer 5 and above) contain the actual data in the packet.

Data messages transmitted by packet data techniques are typically split into fragments. Each fragment is the information that is transmitted in a packet. The fragments are in turn split into a sequence of data blocks and each block, as well as the entire fragment, may then be individually protected against transmission errors.

Errors in the transmission of data can arise from many sources, such as adjacent channel and co-channel interference, fading, and undesired distortion in a sending device's transmitter and/or a receiving device's receiver. The result of the introduction of errors is a demodulated bit stream at the receiving communication device (data recipient) that is different from the bit stream that was modulated and transmitted by the sending communication device (data source). One method used to combat this problem is to include enough redundant information along with each block of data to allow the data recipient to deduce that an error occurred and to request a retransmission of either a particular data block or an entire message. The redundant information, or error detection code, is interleaved among the data blocks in communication protocol layer 2. In some communication systems, error detection followed by retransmission is preferred to error correction because it is more efficient (i.e., much less overhead is consumed in sending an error detection code and retransmitting erroneous data blocks than is required by an error correction code).

There are many known techniques for generating an error detection code. One such technique is the addition of parity bits. Parity bits indicate whether the sum of a predesignated string of bits is odd or even. If the bits sum to an even number and the associated parity bit indicates an odd number, then an error is indicated and the data recipient requests retransmission of the block. However, this technique facilitates the detection of errors in an odd number of bits only. That is, with parity bit error detection, if an even number of bits are incorrect, then an error will not be detected. Another known technique for generating an error detection code is a cyclic redundancy check (CRC) code (also known as a polynomial code). A CRC code treats a bit string as though it is a coefficient list for a polynomial, each coefficient being either a 0 or a 1. Thus, a data block of 'm' bits can be thought of as a coefficient list for an 'm−1' degree polynomial, the highest order term being $x^{m-1}$ and the lowest order term being $x^0$. For example, the bit stream 10101 equates to the polynomial $x^4+x^2+x^0$.

When using a CRC code, the data source and the data recipient must agree upon a generator polynomial, G(x), of degree 'g−1' in which the high- and low-order bits are ones and the intervening bits are a combination of zeros and ones. The generator polynomial G(x) can be selected in accordance with known techniques so as to maximize its error detection rate. If the data block has 'm' bits and can be represented by the polynomial M(x) (degree 'm−1'), then the CRC is a predesignated number of bits ('k' bits) appended to the lower end of the data so that it now contains m+k bits and corresponds to a polynomial, P(x), that is of order '(m+k)−1.' The appended bits are typically referred to as a checksum. Standard practice is to use a checksum of 16 or 32 bits (i.e., k=16 or 32). The additional k bits are selected so that the new polynomial, P(x), is perfectly divisible by G(x) using modulo 2 arithmetic. Therefore, the additional k bits are selected such that m+k>g. If a non-zero remainder results when the data recipient divides the appended data block by G(x), then an error is indicated and retransmission is requested.

Wireless communications present greater opportunity for random channel error than do wireline communications and packet data transmissions are typically error intolerant. Thus, the problem with using merely a single CRC code per data block is that it would require too lengthy a checksum (i.e., it would consume an undesirable amount of overhead) to achieve the error detection rate required for wireless communication purposes. Thus, for wireless communications to approach the precision of wireline communications, a better error detection technique than a single CRC code per data block is required. The Telecommunication Industry Association (TIA) has proposed an improved error detection scheme in the publication entitled "TIA/EIA Standard, Project 25 FDMA Common Air Interface New Technology Standards Project Digital Radio Technology Standards," TIA/EIA-102.BAAA, published by the Telecommunication Industry Association in May 1998.

The TIA proposes that each individual data block in the packet contain 16 octets of data and two octets of numbering and CRC information. If an error is detected in an individual block, then a retransmission of that block can be requested. This is known as selective automatic retransmission request (SARQ). The TIA further proposes that there be a four octet CRC parity check (i.e., a message CRC) covering the data of the entire packet that would be included in the last four octets of the last data block. Polynomial division requires that the division be undertaken starting with the highest order factors and sequentially progressing down to the lowest order factors. Determination and confirmation of the message CRC code requires that all data blocks be sequentially ordered, so that data blocks received either out of order or with errors would terminate all further determination of the CRC code. This can be an especially significant problem for wireless communication systems, where the data blocks of a packet are not necessarily correctly received in sequential order. The result could be a potential computational load placed on the data processor if message CRC code computations are deferred and a potential processing delay in computing the message CRC while awaiting retransmitted data blocks. Deferred CRC code computations can create processor utilization spikes and can introduce a significant delay in the sending of a message acknowledgment back to the sender.

Therefore, a need exists for a method and apparatus of transmitting and receiving data packets using multi-layer error detection that does not result in excessive processor processing and acknowledgment delays.

BRIEF DESCRIPTION OF THE DRAWINGS

FIG. 1 is a block diagram illustration of a communication system in accordance with a preferred embodiment of the present invention.

FIG. 2 is a block diagram illustration of a communication device in accordance with a preferred embodiment of the present invention.

DESCRIPTION OF A PREFERRED EMBODIMENT

Figure 3:
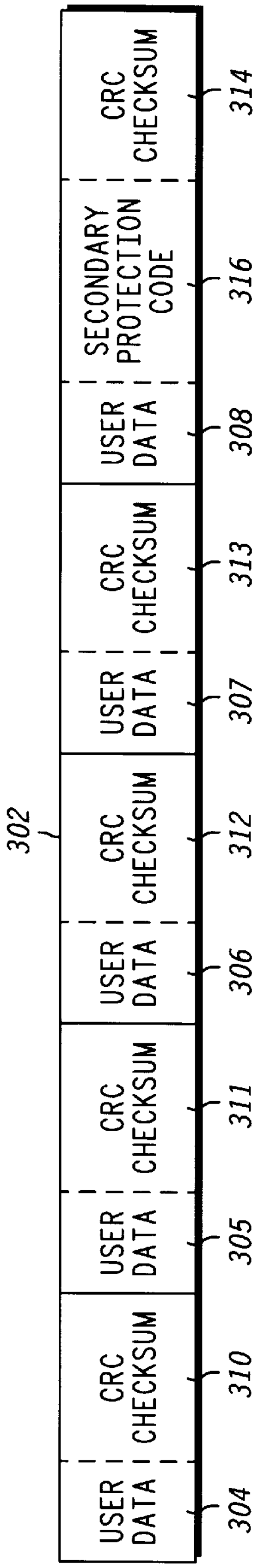
FIG. 3 is a block diagram illustration of layers of error detection for an information packet in accordance with a preferred embodiment of the present invention.

Generally, the present invention encompasses a method and apparatus for transmitting and receiving information packets using multiple layers of error detection. A sending communication device provides user information and divides the user information into data blocks. The sending device then determines a first layer of error detection for each of the data blocks to produce first layer error detections. The sending device also determines a second layer of error detection for each of the data blocks to produce second layer error detections, wherein the second layer error detections are distinct from the first layer error detections. The sending device finally determines a secondary protection code based on the second layer error detections and transmits an information packet to a receiving communication device, wherein the information packet includes the data blocks, the first layer error detections, and at least a portion of the secondary protection code.

Upon receiving the information packet, the receiving device processes the information packet by recovering each data block and performing a first level error check on each data block. The first level error check is performed by determining the first layer error detection for each data block. Once a first level error check for a particular data block is successful, the receiving device accepts the data block and determines the corresponding second layer error detection for the data block. The receiving device also determines a portion of a computed secondary protection code based on the determined second layer detection to perform a portion of a second level error check. The receiving device performs the first level error check and determines respective portions of the computed secondary protection code while processing each received data block. Once all the data blocks have been processed, the receiving device completes the second level error check by determining the computed secondary protection code based on each portion of the code that was previously determined and compares the computed secondary protection code to the secondary protection code contained in the information packet. Based on the comparison, the receiving device determines whether the second level error check was successful. When the second level error check was successful, the receiving device accepts the entire information packet.

By transmitting and receiving information packets in this manner, the present invention provides for multiple layers of error detection to increase the probability of recovery of the user information contained in the information packet, without causing instantaneous processor load surges to perform the error detection processing. With the present invention, the secondary protection code can be incrementally calculated as the data blocks are recovered and accepted, regardless of sequential order. Since the secondary code is incrementally calculated as individual blocks are accepted, instead of being determined after all user information has been recovered, the loading of the processor after the entire packet is received and any delay in the sending of an acknowledgment is minimized. Furthermore, since sequence is not important in the calculation of the secondary protection code, when a data block is rejected by the receiving device and retransmitted by the sending device, the incremental calculation of the secondary protection code at the receiving device can continue with second layer detections of blocks subsequently received and the second layer detection of the rejected block can be included in the secondary protection code calculation upon reception after retransmission.

The present invention can be more fully understood with reference to FIGS. 1–5. FIG. 1 illustrates a block diagram depiction of a radio communication system 100 in accordance with a preferred embodiment of the present invention. The preferred radio communication system 100 comprises an infrastructure communication device 101 and at least two radio communication devices 103, 104 (two shown). The infrastructure communication device 101 preferably comprises "iDEN" communication system infrastructure equipment, such as the Motorola Data Gateway, that is commercially available from Motorola, Inc. of Schaumburg, Ill. In an alternative embodiment, the radio communication system 100 might comprise any cellular or trunked communication system, such as communication systems that implement one or more of the following cellular platforms: Personal Communication Service (PCS), Advanced Mobile Phone Service (AMPS), Narrowband AMPS (NAMPS), Unites States Digital Cellular (USDC), Code Division Multiple Access (CDMA), or Global System for Mobile Communications (GSM).

The radio communication devices 103, 104 preferably comprise "iDEN" radiotelephones. Each of the communication devices 101, 103, 104 preferably includes a transmitter 210, a receiver 212, a processor 206, a memory 208, an information source 202, and an information sink 214 as illustrated in block diagram form in FIG. 2. The transmitter 210 preferably comprises a linear transmitter capable of transmitting quadrature amplitude modulated (QAM) signals. The receiver 212 preferably comprises a digital receiver capable of receiving QAM signals. In a sending communication device (e.g., communication device 103), the information source 202 provides the processor 206 with user information that is to be transmitted. The information source 202 preferably comprises a data port of the sending communication device 103.

The processor 206, which preferably comprises a microprocessor, receives the user information from the information source 202, divides the user information into multiple data blocks in accordance with known techniques, determines a first and a second layer of error detection for each of the data blocks as discussed in more detail below, constructs an information packet that includes the multiple data blocks, the primary layers of error detection, and at least a portion of a secondary protection code derived from the secondary layers of error detection, and routes the information packet to the transmitter 210. The transmitter 210 then transmits the information packet to a receiving communication device (e.g., communication device 101) via one or more radio communication resources 106, 107 (two shown).

In an alternate embodiment of the sending communication device 103, the data blocks and the primary and secondary layers of error detection are stored in the memory 208 until the sending communication device 103 receives an acknowledgment signal from the receiving communication device 101 informing the sending communication device 103 that a complete, error-free packet has been received by the receiving communication device 101. In the event that the sending communication device 103 receives a request from the receiving communication device 101 to retransmit one or more of the data blocks, the data blocks and associated layers of error detection can be retrieved from the memory 108 and retransmitted.

In the receiving communication device 101, the receiver 212 receives the information packet and routes the information packet to the processor 206. The processor 206 recovers each of the multiple data blocks, determines the first layer of error detection for each data block to perform a first level error check, and, when the first level error check is successful, accepts each data block. When the first level error check is unsuccessful, the transmitter 210 transmits an acknowledgment signal indicating that at least one data block was not correctly received.

The processor 206 also determines, preferably only after accepting the data block, a second layer of error detection for the data block and a portion of a computed secondary protection code, as discussed in more detail below, to perform a portion of a second level error check. Upon acceptance of all the data blocks of the information packet, the processor 206 completes the determination of the computed secondary protection code and compares the computed secondary protection code to the secondary protection code contained in the information packet to complete the second level error check. When the computed secondary protection code matches the secondary protection code contained in the information packet, the second level error check is successful and the processor 206 accepts the entire information packet. When the computed secondary protection code does not match the secondary protection code contained in the information packet, the second level error check is unsuccessful and the transmitter 210 transmits an acknowledgment signal indicating that the information packet in its entirety were not correctly received.

FIG. 3 is a block diagram illustration of layers of error detection for a single information packet 302 in accordance with a preferred embodiment of the present invention. In the preferred embodiment, the processor 206 receives user information from the information source 202 and divides the user information into multiple data blocks 304–308 (five shown). The processor 206 then determines a first layer of error detection and a second layer of error detection for each one of the data blocks to produce multiple first layers of error detection and multiple second layers of error detection. Each first layer of error detection comprises a first error detection code 310–314 (five shown). Each first error detection code preferably comprises a multiple-bit checksum based on a first CRC code. Each second layer of error detection comprises a second error detection code. Each second error detection code preferably comprises a multiple-bit checksum based on a second CRC code. In the preferred embodiment, the second error detection code is based on a generator polynomial that is different (e.g., has no common factors) from the generator polynomial used to calculate the first error detection code. Those of ordinary skill in the art will appreciate that checksums of various sizes and error detection codes other than CRC codes may be used to derive the first and second error detection codes without departing from the spirit and scope of the present invention.

In the preferred embodiment, the first error detection codes 310–314 are interleaved among the data blocks 304–308. For example, first error detection code 310 is the error detection code protecting data block 304, first error detection code 312 is the error detection code protecting data block 306, and so on. The second error detection codes are stored in the memory 208, which is preferably a random access memory (RAM), and are summed together using modulo 2 arithmetic without carry forward (i.e., exclusive OR'd, or XOR'd) to produce a secondary protection detection code 316 that is multiple bits in length, but preferably shorter than a data block. The secondary protection code 316 is placed in either the last data block (e.g., data block 308), when a sufficient number of unused bits are available, or at the end of a newly created data block. The data block 308 containing the secondary protection code is also protected by a first layer of error detection 314. The data blocks 304–308, together with their appended first error detection codes 310–314, are then grouped into the information packet 302 and modulated onto a radio communication resource, such as a radio frequency carrier, for subsequent transmission.

In the preferred embodiment, the secondary protection code 316 is incrementally determined simultaneously with the determination of the second error detection codes for each data block 304–308. Because the secondary protection code 316 is produced by XOR'ing the second error detection codes, the second error detection codes can be combined in any order at any time to produce the secondary protection code 316. Thus, the second error detection codes can be stored, in any order, and the incremental determination of the secondary protection code 316 can be reserved and undertaken at moments of low processor utilization.

In the receiving communication device 101, the receiver 212 receives the information packet 302 and routes the packet 302 to the processor 206. The processor 206 recovers the data blocks 304–308 and the first layers of error detection 310–314. For a first level error check, the processor 206 divides each data block (e.g., data block 304) and its associated first layer of error detection (e.g., error detection code 310) by the same generator polynomial as was used to create the first layers of error detection 310–314 by the sending communication device 103. If the division of a data block and its associated first layer of error detection results in no remainder, then the first level error check for that particular error block is successful. If the division results in a remainder, then the error check for that particular block is unsuccessful.

The processor 206 also determines second error detection codes for each data block using the same generator polynomial as was used to create the second layers of error detection by the sending communication device 103. The second error detection codes are summed together, using modulo 2 arithmetic without carry forward, to determine a secondary protection code. The determined secondary protection code is compared to the secondary protection code 316 in the information packet 302 for a second level error check. If the determined secondary protection code matches the secondary protection code 316, then the second level error check is successful. If the determined secondary protection code does not match the secondary protection code 316, then the second level error check is unsuccessful.

As described above, the present invention provides for information packet transmission and reception using multiple layers of error detection, while allowing for improved regulation of processor utilization. The first error detection codes 310–314 are used to individually protect each data block. The second error detection codes are incrementally combined using XOR arithmetic to produce a secondary protection code 316 that is used to protect the entirety of the user information in the packet. The second error detection codes can be stored and the secondary protection code 316 can be determined at any time during the processing of the packet, such as during idle processor time (i.e., a time when the processor is not encoding or recovering user information, respectively). The ability to determine the secondary protection code during idle processor time eliminates processor utilization spikes or the need for faster or larger capacity processors to accommodate the spikes.

Figure 4:
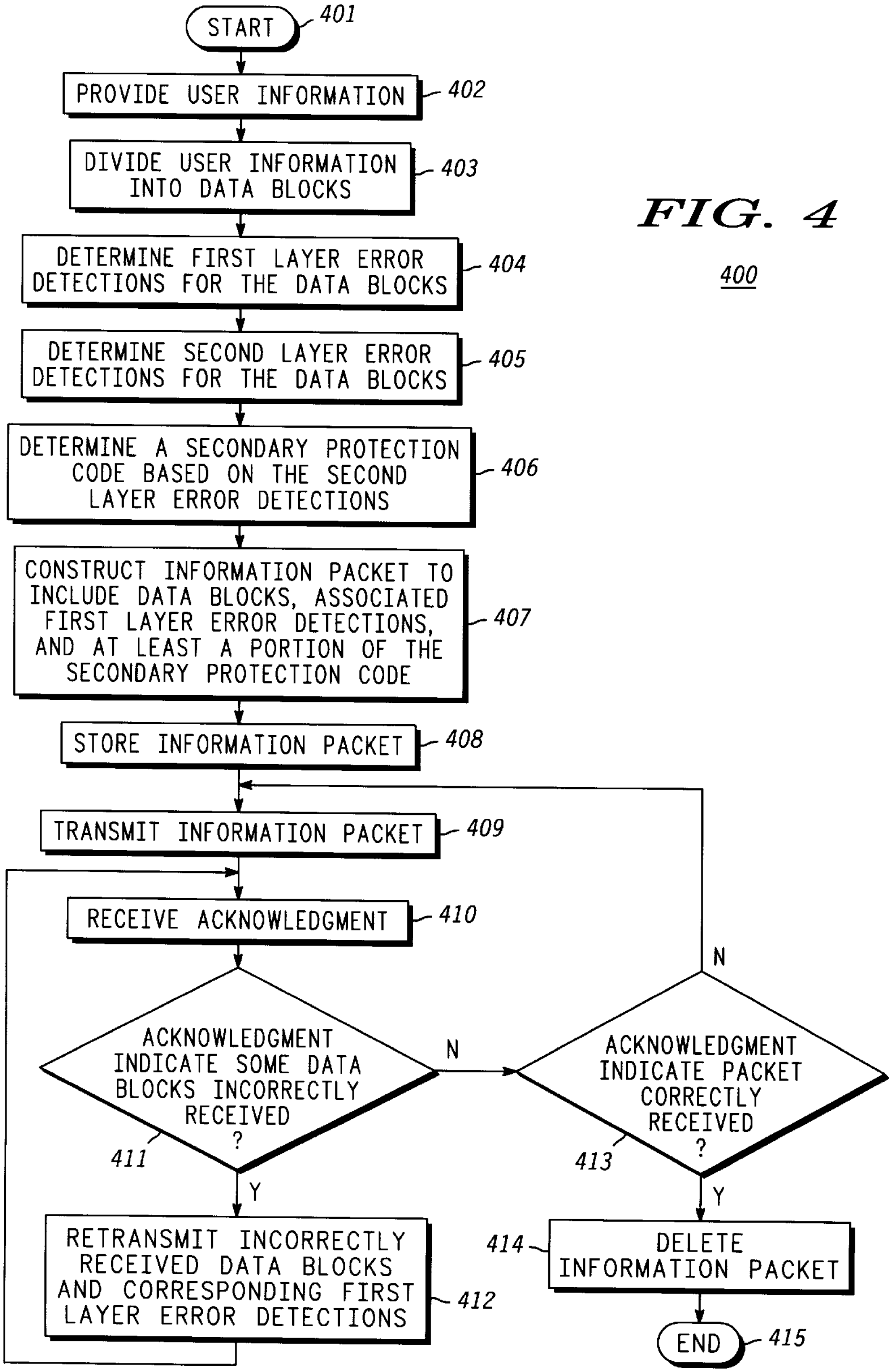
FIG. 4 is a logic flow diagram of steps executed by a communication device to transmit information packets using multiple layers of error detection in accordance with a preferred embodiment of the present invention.

FIG. 4 illustrates a logic flow diagram 400 of steps executed by a communication device to transmit information packets using multiple layers of error detection in accordance with a preferred embodiment of the present invention. The logic flow begins (401) when the communication device provides (402) user information for transmission. The communication device divides (403) the user information into multiple data blocks and determines (404) a first layer of error detection for each data block. The communication device also determines (405) a second layer of error detection for each data block. Each layer of error detection preferably comprises a respective error detection code, such as a multiple bit checksum based on a corresponding CRC code. In the preferred embodiment, each CRC code is generated from a unique generator polynomial.

In addition to determining the two layers of error detection for each data block, the communication device determines (406) a secondary protection code. In the preferred embodiment, the secondary protection code is determined by adding the error detection codes constituting the second layers of error detection in modulo 2 without carry forward (i.e., exclusive OR'ing, or XOR'ing the second error detection codes of the data blocks). The secondary protection code is preferably multiple bits in length, but shorter than a data block. Since the secondary protection code is a product of the XOR'ing of the second error detection codes of the data blocks, the second error detection codes can be combined in any order at any time. The fact that the second error detection codes can be combined in any order at any time allows a receiving device to incrementally determine the secondary protection code independent of the order that the data blocks are received by the receiving device and to reserve the determination of the secondary protection code for moments of low processor utilization.

Once the two layers of error detection for each data block and the secondary protection code are determined, the communication device constructs (407) an information packet that includes the data blocks, their associated first layer error detections, and at least a portion of the secondary protection code. In the preferred embodiment, the information packet includes the entire secondary protection code. However, in an alternative embodiment, the information packet might include only a portion of the secondary protection code due to a lack of available unused bits. In the latter embodiment, the receiving device must receive multiple information packets to reconstruct the secondary protection code. Once the information packet is constructed, the communication device stores (408) the information packet for later use in the event that a retransmission of one or more portions of the packet is necessary and transmits (409) the information packet to a receiving communication device.

Subsequent to transmitting the information packet, the communication device receives (410) an acknowledgment signal from the receiving device. The communication device then determines (411) whether the acknowledgment signal indicates that one or more data blocks have been incorrectly received. When the acknowledgment indicates that one or more blocks have been incorrectly received, the communication device retrieves the incorrectly received data blocks from the stored information packet and retransmits (412) the incorrectly received data blocks and their corresponding first layer error detections. When the acknowledgment indicates that the data blocks have been correctly received, the communication device determines (413) whether the acknowledgment indicates that the entire information packet has been correctly received. When the information packet has not been correctly received, the communication device transmits (409) the entire information packet. When the acknowledgment indicates that the information packet has been correctly received, the communication device deletes (414) the information packet from memory and the logic flow ends (415). As described above with respect to blocks 408–415, the present invention supports SARQ protocols to produce a more robust error detection system that provides for confirmation of correctly received packets and for retransmission of data blocks that have been received with errors.

In general, the present invention as described above with respect to FIG. 4 provides an improved system of error detection for a packet of information. Two layers of error detection are provided for and transmitted with each packet, both layers based on CRC codes, but each layer's CRC code uses a different generator polynomial. The first error detection layer provides for the detection of errors in each individual data block and comprises error detection codes determined for each data block. The second error detection layer provides for the detection of errors in the entire information packet and comprises the XOR'd product of second error detection codes determined for each data block. A receiving device need not determine the second error detection layer at any particular time during the processing of the packet and instead can reserve the determination of the second error detection layer for otherwise idle processor time. The processing of the second error detection layer during idle processor times eliminates processor utilization spikes or the need for faster or larger capacity processors to accommodate the spikes.

Figure 5:
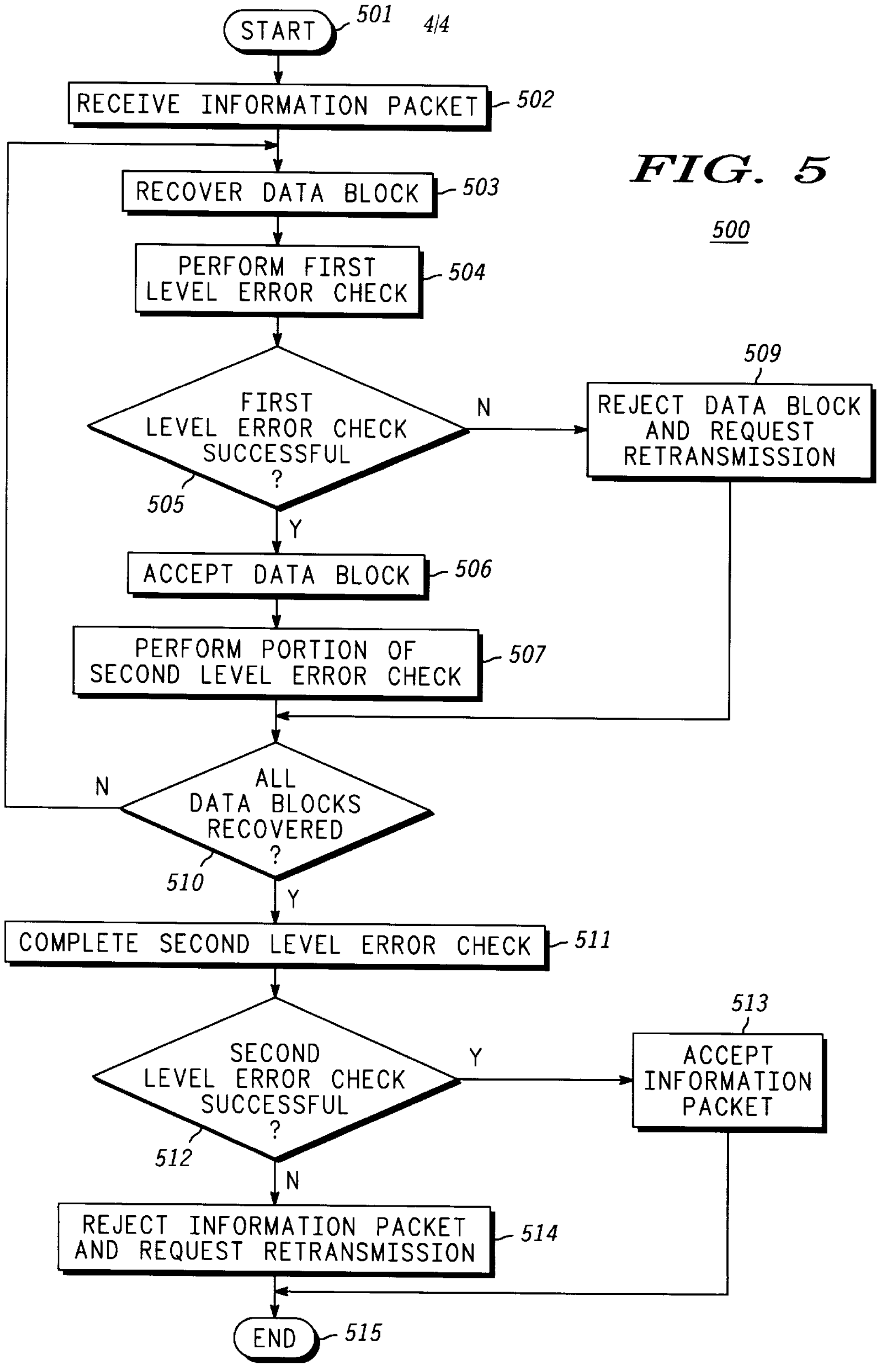
FIG. 5 is a logic flow diagram of steps executed by a communication device to receive information packets having multiple layers of error detection in accordance with a preferred embodiment of the present invention.

FIG. 5 illustrates a logic flow diagram 500 of steps executed by a communication device to receive information packets using multiple layers of error detection in accordance with a preferred embodiment of the present invention. The logic flow begins (501) when the communication device receives (502) an information packet. The information packet includes multiple data blocks, a first layer error detection for each data block, and an expected secondary protection code. Each layer of error detection preferably comprises a respective error detection code, such as a multiple-bit checksum based on a corresponding CRC code. In the preferred embodiment, each CRC code is generated from a unique generator polynomial.

Once the information packet is received, the communication device recovers (503) the first data block and determines a first layer of error detection for the data block to perform (504) a first level error check. In the preferred embodiment, the first layer of error detection is a multiple-bit checksum based on a CRC code.

The communication device then determines (505) whether the first level error check is successful. In the preferred embodiment, the first level error check comprises appending the checksum to the data block and dividing the data block, as appended, by a predetermined generator polynomial. If the division produces a remainder of zero, then the first level error check is successful. If the division produces a non-zero remainder, then the first level error check is unsuccessful.

When the first level error check is successful, the communication device accepts (506) the data block and performs (507) a portion of a second level error check by determining a second layer of error detection for the data block and a portion of a computed secondary protection code based on the second layer of error detection. Similar to the first layer of error detection, the second layer of error detection is also a multiple-bit checksum based on a CRC code. However, the second layer of error detection is distinct from the first layer of error detection in that the second layer of error detection is based on a different generator polynomial than the first layer of error detection. In the preferred embodiment, the secondary protection code is determined by summing, using modulo 2 arithmetic without carry forward (i.e., exclusive OR'ing, or XOR'ing the second error detection codes of the data blocks) the multiple-bit checksums constituting the second layers of error detection for the data blocks. Since the secondary protection code is a product of the XOR'ing of multiple-bit checksums, the determination of the secondary protection code can be undertaken in any order at any time, thereby allowing the communication device to reserve the determination of the secondary protection code for time periods in which the processor is not processing and recovering the received user information. Therefore, the second layers of error detection for the data blocks need not be sequentially determined as each data block is recovered, but instead can be determined during a time in which the processor is not processing and recovering the received user information.

When the first level error check is unsuccessful, the communication device rejects (509) the data block and requests a retransmission of the data block. The retransmission request preferably comprises an acknowledgment signal indicating which data block or blocks were not correctly received.

After the communication device performs the steps in blocks 502–509 for a first data block of the received information packet, the communication device determines (510) whether all the data blocks in the information packet have been recovered. When all the data blocks have not been recovered, the communication device repeats the steps recited in blocks 503 through 509 for all data blocks included in the information packet. Preferably, the steps in blocks 503–507 are also performed for retransmitted data blocks. If a data block is rejected, the determination of the secondary protection code may continue with respect to subsequently accepted blocks because the XOR'ing of the second layers of error detection need not be done sequentially. When a retransmitted version of a rejected block is accepted, the second error detection code for that block can be determined and included in the determination of the secondary protection code upon the block's acceptance.

Once all the data blocks in the information packet have been recovered, the communication device completes (511) the second level error check and determines (512) whether the second level error check was successful. Completion of the second level error check comprises completing the determination of the computed secondary protection code based on each portion of the computed secondary protection code and comparing the computed secondary protection code to the expected secondary protection code that was included in the information packet. When the computed secondary protection code matches the expected secondary protection code, the second level error check is successful and the communication device accepts (513) the information packet and preferably transmits an acknowledgment signal indicating that the information packet was correctly received. When the computed secondary protection code does not match the expected secondary protection code, the second level error check is unsuccessful and the communication device rejects (514) the information packet and requests a retransmission of the entire information packet. Upon acceptance or rejection of the information packet, the logic flow ends (515).

Generally, the present invention encompasses a method and apparatus for transmitting and receiving information packets using multiple layers of error detection. A first error detection code, based on a CRC code, is used to protect each data block. As the data recipient receives and demodulates each data block, the data recipient can either accept the block or request a retransmission of the block based on whether the first error detection code indicates a bit error. A secondary protection code, also based on a CRC code, is then used to protect the entirety of the user information in the packet. The secondary protection code can be incrementally determined as the data blocks are received and accepted, regardless of sequential order. Since the secondary protection code is incrementally determined as individual blocks are accepted, instead of being determined all at once after all data blocks have been accepted, processor utilization can be better regulated and delays associated with sending of an acknowledgment can be minimized. Furthermore, since sequence is not important in the calculation of the secondary protection code, rejection of a data block does not impede the incremental determination of the secondary protection code because the determination can continue with blocks subsequently received and the rejected block can be included after retransmission. After the data recipient has received all of the data blocks error-free, the recipient can then accept the entire packet or request a retransmission of the entire packet based on whether the secondary protection code detects an error.

While the present invention has been particularly shown and described with reference to particular embodiments thereof, it will be understood by those skilled in the art that various changes in form and details may be made therein without departing from the spirit and scope of the present invention.

I claim:

1. A method of transmitting information packets in a communication device, the method comprising the steps of:

providing user information to be transmitted;

dividing the user information into at least two data blocks;

determining a first layer of error detection for each of the at least two data blocks to produce a plurality of first layer error detections;

determining a second layer of error detection for each of the at least two data blocks to produce a plurality of second layer error detections, the plurality of second layer error detections being distinct from the plurality of first layer error detections, wherein the distinctiveness of the plurality of second layer error detections from the plurality of first layer error detections results in expected differences at least between corresponding second layer error detections and first layer error detections;

determining a secondary protection code based on the plurality of second layer error detections; and transmitting an information packet that includes the at least two data blocks, the plurality of first layer error detections, and at least a portion of the secondary protection code in order to increase a probability of recovery of the user information at a receiving communication device.

2. The method of claim 1, wherein the step of determining a first layer of error detection comprises the step of determining a first error detection code for each of the at least two data blocks; and wherein the step of determining a second layer of error detection comprises the step of determining a second error detection code for each of the at least two data blocks; wherein the plurality of second layer error detections is based on a generator polynomial that is different from the generator polynomial used to determine the plurality of first layer error detections.

3. The method of claim 2, wherein each of the first error detection codes comprises a multiple-bit checksum based on a cyclic redundancy check code.

4. The method of claim 2, wherein each of the second error detection codes comprises a multiple-bit checksum based on a cyclic redundancy check code.

5. The method of claim 1, wherein the step of determining a secondary protection code comprises the step of summing, using modulo 2 arithmetic with no carry forward, the plurality of second layer error detections.

6. The method of claim 1, further comprising the step of storing the information packet in memory to produce a stored information packet.

7. The method of claim 6, further comprising the steps of:

receiving an acknowledgment signal from the receiving communication device, the acknowledgment signal indicating at least one data block that was not correctly received to produce at least one incorrectly received data block; and responsive to the acknowledgment signal, retransmitting the at least one incorrectly received data block together with a corresponding first layer of error detection.

8. The method of claim 6, further comprising the steps of:

receiving an acknowledgment signal from the receiving communication device, the acknowledgment signal indicating that the information packet was correctly received; and responsive to the acknowledgment signal, deleting the stored information packet.

9. The method of claim 1, wherein the communication device includes a processor for processing and encoding the user information and wherein the step of determining a secondary protection code comprises the step of determining, by the processor, the secondary protection code during a time period in which the processor is not processing and encoding the user information.

10. A method of receiving information packets in a communication device, the method comprising the steps of:

a) receiving an information packet that includes a plurality of data blocks, a first layer of error detection for each of the plurality of data blocks, and an expected secondary protection code;

b) recovering a first data block of the plurality of data blocks;

c) determining the first layer of error detection for the first data block to perform a first level error check;

d) determining whether the first level error check was successful;

e) when the first level error check was successful, accepting the first data block; and determining a second layer of error detection for the first data block and a portion of a computed secondary protection code based on the second layer of error detection to perform a portion of a second level error check, wherein the second layer of error detection is distinct from the first layer of error detection and wherein the distinctiveness of the second layer of error detection from the first layer of error detection results in expected differences between the second layer of error detection and the first layer of error detection at least to the extent the layers of error detection correspond;

f) repeating steps (b) through (e) for at least a second data block of the plurality of data blocks;

g) responsive to step (f), determining the computed secondary protection code based on each portion of the computed secondary protection code and comparing the computed secondary protection code to the expected secondary protection code to complete the second level error check;

h) determining whether the second level error check was successful; and i) when the second level error check was successful, accepting the information packet.

11. The method of claim 10, wherein the first layer of error detection comprises a multiple-bit checksum based on a cyclic redundancy check code.

12. The method of claim 10, wherein the second layer of error detection comprises a multiple-bit checksum based on a cyclic redundancy check code.

13. The method of claim 12, wherein the step of determining a portion of a computed secondary protection code comprises the step of summing, using modulo 2 arithmetic with no carry forward, at least two multiple-bit checksums determined for at least two data blocks to produce the portion of a computed secondary protection code.

14. The method of claim 10, wherein the communication device includes a processor for processing and recovering received user information and wherein the step of determining a portion of a computed secondary protection code comprises the step of determining, by the processor, a portion of a computed secondary protection code during a time period in which the processor is not processing and recovering the received user information.

15. The method of claim 10, wherein step (e) further comprises the steps of:

when the first level error check was unsuccessful,
rejecting the first data block; and
requesting retransmission of the first data block.

16. The method of claim 15, wherein step (a) further comprises receiving retransmitted data blocks and wherein step (f) is further performed on the retransmitted data blocks.

17. The method of claim 15, wherein the step of requesting retransmission comprises the step of transmitting an acknowledgment signal indicating which data blocks of the plurality of data blocks were not correctly received.

18. The method of claim 10, wherein step (i) comprises the step of transmitting an acknowledgment signal indicating that the information packet was correctly received.

19. A communication device comprising:

an information source for providing user information to be transmitted;

a processor, coupled to the information source, that receives the user information, divides the user information into a plurality of data blocks, determines a first layer of error detection for each of the plurality of data blocks to produce a plurality of first layer error detections, determines a second layer of error detection for each of the plurality of data blocks to produce a plurality of second layer error detections, the plurality of second layer error detections being distinct from the plurality of first layer error detections, and determines a secondary protection code based on the plurality of second layer error detections, wherein the distinctiveness of the plurality of second layer error detections from the plurality of first layer error detections results in expected differences at least between corresponding second layer error detections and first layer error detections; and a transmitter, coupled to the processor, for transmitting an information packet that includes the plurality of data blocks, the plurality of first layer error detections, and at least a portion of the secondary protection code.

20. The communication device of claim 19, further comprising:

a memory, coupled to the processor, that stores the information packet.

21. The communication device of claim 19, further comprising:

a receiver, coupled to the processor, that receives an acknowledgment signal indicating which data blocks of the plurality of data blocks were not correctly received by a receiving communication device.

22. A communication device comprising:

a receiver that receives an information packet including a plurality of data blocks, a first layer of error detection for each of the plurality of data blocks, and an expected secondary protection code;

a processor, coupled to the receiver, that recovers each data block of the plurality of data blocks, determines the first layer of error detection for each data block to perform a respective first level error check, accepts each data block when the respective first level error check was successful, determines a second layer of error detection for each data block and a computed secondary protection code based on each second layer of error detection to perform a portion of a second level error check, compares the computed secondary protection code to the expected secondary protection code to complete the second level error check; and accepts the information packet when the second level error check was successful, wherein the second layer of error detection is distinct from the first layer of error detection and wherein the distinctiveness of the second layer of error detection from the first layer of error detection results in expected differences between the second layer of error detection and the first layer of error detection at least to the extent the layers of error detection correspond; and a transmitter, coupled to the processor, that transmits an acknowledgment signal indicating at least one data block of the plurality of data blocks that was not correctly received by the communication device when the first level error check was unsuccessful and that transmits an acknowledgment signal indicating that the plurality of data blocks were not correctly received by the communication device when the second level error check was unsuccessful.

* * * * *

UNITED STATES PATENT AND TRADEMARK OFFICE

CERTIFICATE OF CORRECTION

PATENT NO. : 6,173,431 B1
DATED : January 9, 2001
INVENTOR(S) : Rittle

It is certified that error appears in the above-identified patent and that said Letters Patent is hereby corrected as shown below:

<u>Title page,</u>
Item [*] Notice, delete the phrase "by 0 days" and insert -- by 19 days --

Signed and Sealed this

Twelfth Day of October, 2004

JON W. DUDAS
*Director of the United States Patent and Trademark Office*